United States Patent
Park et al.

(10) Patent No.: US 7,869,256 B2
(45) Date of Patent: *Jan. 11, 2011

(54) BI-DIRECTIONAL RESISTIVE RANDOM ACCESS MEMORY CAPABLE OF MULTI-DECODING AND METHOD OF WRITING DATA THERETO

(75) Inventors: Joon-min Park, Seoul (KR); Sang-beom Kang, Hwaseong-si (KR); Woo-yeong Cho, Suwon-si (KR); Hyung-rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/957,812

(22) Filed: Dec. 17, 2007

(65) Prior Publication Data

US 2008/0165598 A1 Jul. 10, 2008

(30) Foreign Application Priority Data

Jan. 4, 2007 (KR) .................... 10-2007-0001181

(51) Int. Cl.
*G11C 11/00* (2006.01)
*G11C 11/14* (2006.01)

(52) U.S. Cl. .................. 365/148; 365/158; 365/163; 365/171; 365/173; 365/175; 365/230.06

(58) Field of Classification Search ............ 365/185.09, 365/185.11, 185.17, 185.18, 185.23, 185.29, 365/185.33, 230.03, 230.06, 148, 158, 163, 365/171, 173, 175; 257/758
See application file for complete search history.

(56) References Cited

U.S. PATENT DOCUMENTS

| 5,282,175 | A | * | 1/1994 | Fujita et al. | ............ 365/230.06 |
| 5,886,942 | A | * | 3/1999 | Akita | .................... 365/230.06 |
| 5,896,340 | A | * | 4/1999 | Wong et al. | ............ 365/230.03 |
| 5,978,263 | A | * | 11/1999 | Javanifard et al. | ....... 365/185.11 |
| 6,128,244 | A | * | 10/2000 | Thompson et al. | ...... 365/230.03 |
| 6,141,269 | A | * | 10/2000 | Shiomi et al. | .......... 365/230.03 |
| 6,314,037 | B1 | * | 11/2001 | Shiomi et al. | .......... 365/230.03 |
| 6,418,075 | B2 | * | 7/2002 | Shimano et al. | ........ 365/189.11 |

(Continued)

FOREIGN PATENT DOCUMENTS

JP 2005222647 8/2005

(Continued)

*Primary Examiner*—Trong Phan
(74) *Attorney, Agent, or Firm*—Volentine & Whitt, PLLC

(57) ABSTRACT

A non-volatile memory device is employed in which data values are determined by the polarities at both ends of a cell, The non-volatile memory device includes a first decoder which decodes a plurality of predetermined bit values of a row address into a first address and is disposed in a row direction of a memory cell array; a second decoder which decodes the other bit values of the row address into a second address and is disposed in a column direction of the memory cell array; and a driver which applies bias voltages to a word line which corresponds to the first address or the second address in accordance with the data values. By including first and second decoders and decoding a row address in two steps, a bi-directional RRAM according to the present invention can perform addressing at high speeds while reducing chip size.

11 Claims, 9 Drawing Sheets

U.S. PATENT DOCUMENTS

| | | | |
|---|---|---|---|
| 6,665,229 B2 * | 12/2003 | Lee et al. | 365/230.06 |
| 7,099,191 B2 * | 8/2006 | Umezawa | 365/185.29 |
| 7,580,276 B2 * | 8/2009 | Sawa et al. | 365/158 |
| 2007/0273030 A1 * | 11/2007 | Yi et al. | |

FOREIGN PATENT DOCUMENTS

| | | |
|---|---|---|
| JP | 2006099882 | 4/2006 |
| JP | 2006203098 | 8/2006 |

* cited by examiner

BI-DIRECTIONAL RESISTIVE RANDOM ACCESS MEMORY CAPABLE OF MULTI-DECODING AND METHOD OF WRITING DATA THERETO

CROSS-REFERENCE TO RELATED PATENT APPLICATION

This application claims the benefit of Korean Patent Application No. 10-2007-0001181, filed on Jan. 4, 2007, in the Korean Intellectual Property Office, the disclosure of which is incorporated herein in its entirety by reference.

BACKGROUND OF THE INVENTION

1. Field of the Invention

Embodiments of the invention relate to non-volatile memories. More particularly, embodiments of the invention relate to a bi-directional resistive random access memory (RRAM) capable of multi-decoding and a method of writing data to the bi-directional RRAM.

2. Discussion of Related Art

Next generation memory demands require highly integrated dynamic random access memory (DRAM), non-volatile flash memory and high-speed static random access memory (SRAM) devices. Currently, phase-change random access memory (PRAM), nano-floating gate memory (NFGM), polymer random access memory (PoRAM), magnetic random access memory (MRAM), ferro-electric random access memory (FRAM), RRAM or the like are regarded as the next generation memory devices that meet these demands.

FIG. 1 is a schematic view of a cell C structure of a conventional bi-directional RRAM having a non-ohmic NO device and a resistance variable device RV. In the RRAM, data is written using variations in the resistance-value of the device. The resistance variable device includes a resistance variable substance disposed between first and second electrodes. The resistance value varies in accordance with an applied voltage or an applied current. For example, in a uni-directional RRAM, the resistance value varies in accordance with the amount of applied voltage or applied current. In a bi-directional RRAM, the resistance value varies in accordance with the amount and the direction of the applied voltage or applied current.

The bi-directional RRAM illustrated in FIG. 1 realizes bi-directivity by including a non-ohmic device. The non-ohmic device is in a high-resistance state when the applied voltage is within a predetermined voltage range of −3V to ~3V with no current being applied. The non-ohmic device is in a low-resistance state when the applied voltage is outside of the predetermined voltage range of −3V to ~3V with an applied current. An example of a bi-directional RRAM utilizing a non-ohmic device and a resistance variable device is disclosed in U.S. Pat. No. 6,909,632.

FIG. 2 is a graph illustrating cell characteristics of the conventional bi-directional RRAM illustrated in FIG. 1. When a writing voltage VW of 6V is applied to the resistance variable substance, a corresponding cell has a first resistance. When a writing voltage −VW of −6V is applied to the resistance variable substance, a corresponding cell has a second resistance. A data value "1" can correspond to when a cell has the first resistance and a data value "0" can correspond to when a cell has the second resistance. That is, in the bi-directional RRAM, the data values "1" and "0" can be written using writing voltages VW and −VW where the magnitudes of these writing voltages at both ends of the cell are the same but the polarities are different.

FIGS. 3A and 3B are schematic views illustrating the operation of writing data to a cell of the conventional bi-directional RRAM illustrated in FIG. 1. Referring first to FIG. 3A, a data value "0" is written to a cell (indicated by a circle) by applying 3V to a word line WL and −3V to a bit line BL (WRITE 0). A data value "1" is written to the cell by applying −3V to the word line WL and 3V to the bit line BL (WRITE 1). Here, 0V is respectively applied to an unselected word line WL' and an unselected bit line BL'. Referring to FIG. 3B, a data value "0" is written to a cell by applying 6V to a word line WL, 0V to a bit line BL, and 3V respectively to an unselected word line WL' and an unselected bit line BL' (WRITE 0). On the other hand, a data value "1" is written to the cell by applying 0V to the word line WL, −6V to the bit line BL, and −3V respectively to the unselected word line WL' and the unselected bit line BL' (WRITE 1). The arrows of FIGS. 3A and 3B represent the flowing of the current during the period of writing a data value 0 (WRITE 0) or 1 (WRITE 1).

However, when data is written by applying the writing voltages VW and −VW (VW=6V, −VW=−6V) to a word line WL or a bit line BL as shown in FIG. 3B, the voltage of an unselected word line WL' and an unselected bit line BL' is changed in accordance with a data value. Thus, it is more efficient to write the data by applying ½ writing voltages ½VW and −½VW (½VW=3V, −½VW=−3V) to the word line WL or the bit line BL as shown in FIG. 3A. As memory capacity demands increase, multi-decoding of a bi-directional RRAM is required to perform addressing at high speeds and to reduce the resulting chip size.

SUMMARY OF THE INVENTION

Exemplary embodiments of the present invention are directed to a bi-directional resistive random access memory (RRAM) capable of multi-decoding. In an exemplary embodiment, the non-volatile memory device includes a memory cell array having a plurality of memory cells disposed in a matrix of rows and columns. A first decoder is configured to decode a plurality of predetermined bit values of a row address associated with a memory cell from the plurality of memory cells into a first address. The first decoder is disposed in a row direction of the memory cell array. A second decoder is configured to decode bit values other than the bit values associated with the row address into a second address. The second decoder is disposed in a column direction of the memory cell array. A driver which communicates with the memory cell array is configured to apply bias voltages to a word line corresponding to the first address or the second address in accordance with the data values.

DESCRIPTION OF EMBODIMENTS

Figure 1:
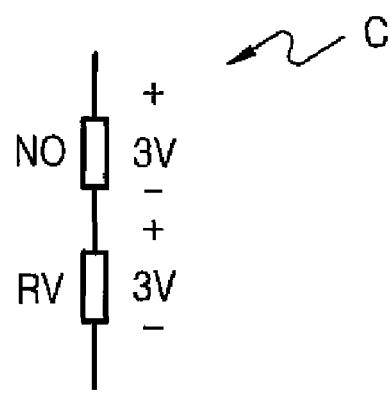
FIG. 1 is a schematic view of a cell structure of a conventional bi-directional resistive random access memory (RRAM)
Figure 2:
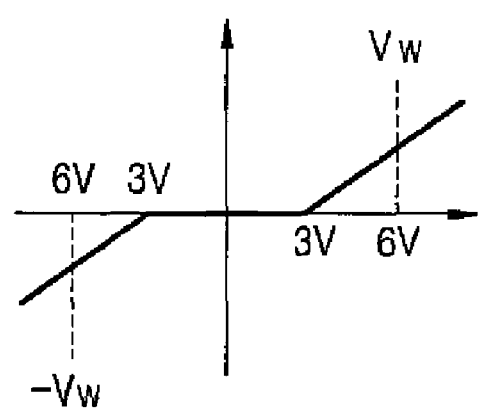
FIG. 2 is a graph illustrating cell characteristics of the conventional bi-directional RRAM illustrated in FIG. 1.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 4:
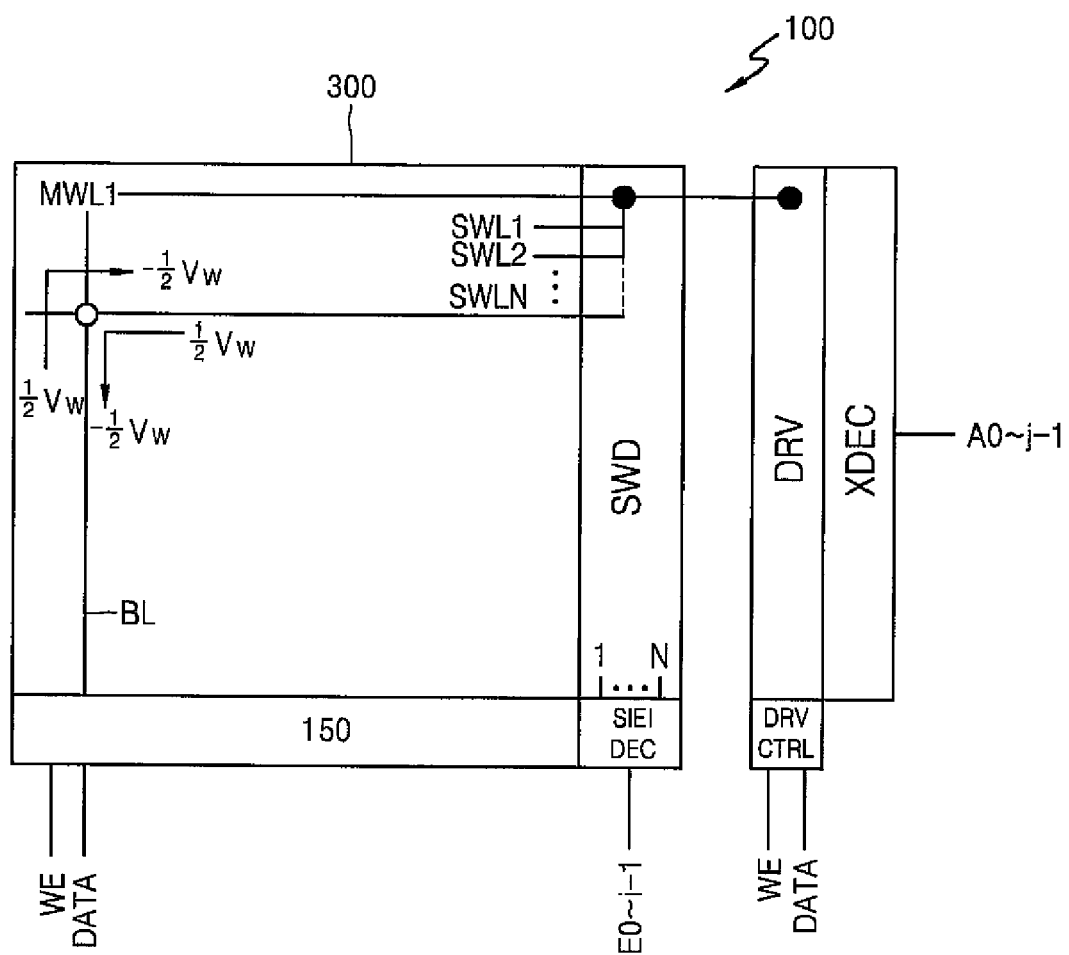
FIG. 4 is a schematic block diagram of a bi-directional RRAM according to an embodiment of the present invention.

FIG. 4 is a schematic block diagram of a bi-directional resistive random access memory (RRAM) 100 where each cell includes a non-ohmic device and a resistance variable device. The non-ohmic device operates as a high-resistant material when voltages at both ends of the cell are within a predetermined range. The non-ohmic device operates as a low-resistance material when the voltages at both ends of the cell are outside the predetermined range. When the non-ohmic device has a low resistance, the resistance variable device has a different resistance value in accordance with the polarities of both ends of the cell.

Bi-directional RRAM 100 includes a first decoder XDEC, a second decoder SIEI DEC and driver DRV. First decoder XDEC decodes predetermined bit values A0 to j-1 of an i+j row address into a first address. The first decoder XDEC is disposed in a row direction of memory cell array 300. Second decoder SIEI DEC decodes predetermined bit values E0 to i-1 of the i+j bit row address into a second address. The second decoder SIEI DEC is disposed in a column direction of memory cell array 300. The bit values A0 to j-1 of the i+j bit row address are decoded into the first address by first decoder XDEC. The bit values E0 to i-1 of the i+j bit row address are decoded into the second address by second decoder SIEI DEC. The first address corresponds to a main word line and the second address corresponds to a local word line. Accordingly, first decoder XDEC activates a main word line indicated by the first address from among a number M (M=2j) of main word lines. Similarly, second decoder SIEI DEC activates a local word line indicated by the second address from among a number L (L=2i) of local word lines. The Nth local word line SWLN connected to a first main word line MWL1 is activated. In this manner, by including first and second decoders and decoding a row address in two steps, a bi-directional RRAM in accordance with the present invention can perform addressing at high speeds while reduce the resulting chip size.

Figure 5:
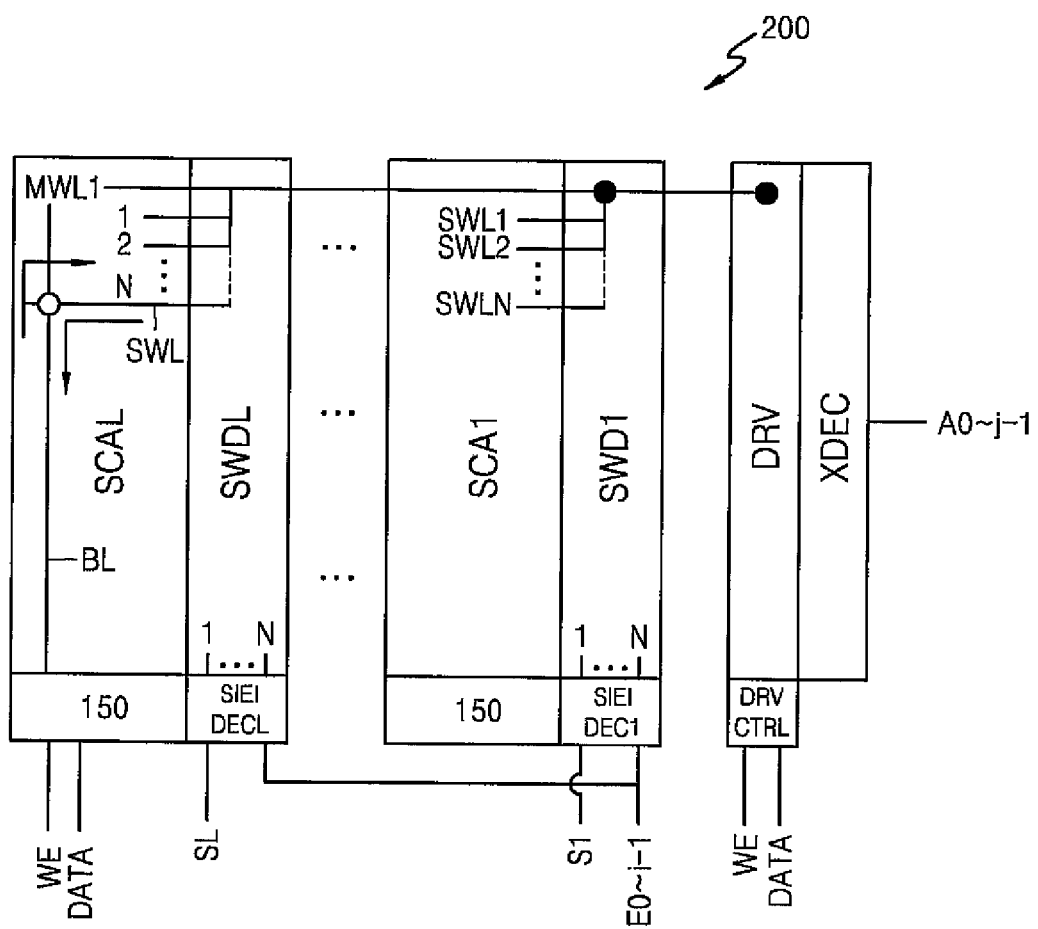
FIG. 5 is a schematic block diagram of a bi-directional RRAM according to an embodiment of the present invention.

FIG. 5 is a block diagram of a bi-directional RRAM 200 having a memory cell array 300 which includes a plurality of sub cell arrays SCA1 through SCAL. Each of the sub cell arrays SCA1 through SCAL includes at least one input/output line (bit line) BL. The sub cell arrays SCA1 through SCAL also include a plurality of second decoders SIEI DEC1 through SIEI DECL, respectively. An Nth local word line SWLN connected to a first main word line MWL1 of an Nth sub cell array SCAL is activated. When data is recorded in a plurality of cells included in the Nth sub cell array SCAL, the Nth sub cell array SCAL operates in response to activation of an Nth sub cell array selection signal SL.

Referring to FIGS. 4 and 5, driver DRV applies bias voltages of ½ writing voltages ½VW and −½VW to a word line activated by first decoder XDEC or second decoder SIEI DEC. The bias voltages correspond to the writing voltages VW and −VW of the data (DATA). For example, in the RRAM illustrated in FIG. 3A, the bias voltages applied to the word line and the bit line are set as ½ the writing voltages ½VW and −½VW. In the RRAM illustrated in FIG. 3B, the bias voltages applied to the word line and the bit line are set as the writing voltages VW and −VW or 0V. The magnitudes of the writing voltages VW and −VW are the same, but the polarities are different in accordance with the data values. A writing voltage VW of 6V is necessary for writing data "1" and a writing voltage −VW of −6V is necessary for writing data "0".

Figure 3:
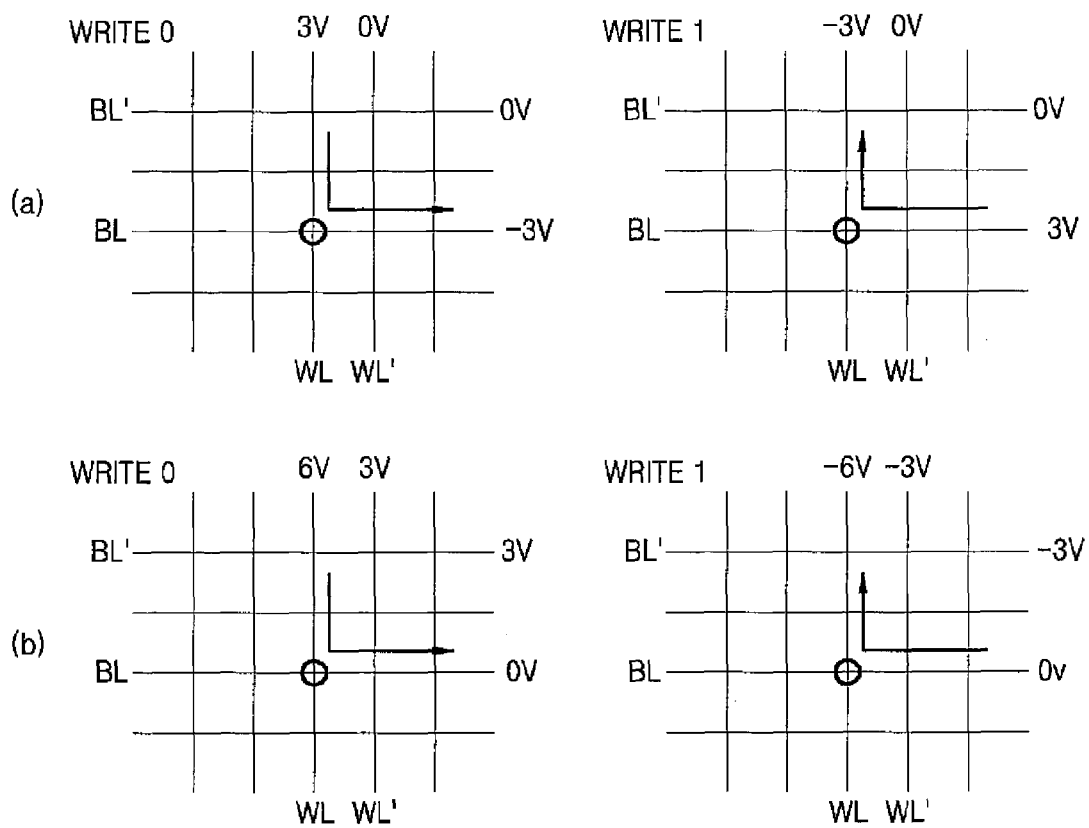
FIGS. 3(a) and 3(b) are schematic views illustrating operations of writing data to a cell of the conventional bi-directional RRAM illustrated in FIG. 1.

Driver DRV illustrated in FIG. 4 or FIG. 5 applies the bias voltages as described with reference to FIG. 3A. Accordingly, a bias voltage applied to the Nth local word line SWLN has the same magnitude as a bias voltage applied to bit line BL, but the polarities of the bias voltages are different (½VW or −½VW). In particular, data value "0" is written to a cell (as referenced by a circle) by applying a ½ writing voltage ½VW to the Nth local word line SWLN, and a ½ writing voltage −½VW to bit line BL. A data value "1" is written to the cell by applying the ½ writing voltage −½VW to the Nth local word line SWLN, and the ½ writing voltage ½VW to the bit line BL. The arrows of FIGS. 4 and 5 represent the flowing of current during the period of writing a data value 0 or 1. The bi-directional RRAM 100 and 200 further includes a Y-decoder/driver 150 to apply the bias voltages to bit line BL as described above. Driver DRV illustrated in FIG. 4 and FIG. 5 is positioned adjacent to first decoder XDEC.

Figure 6:
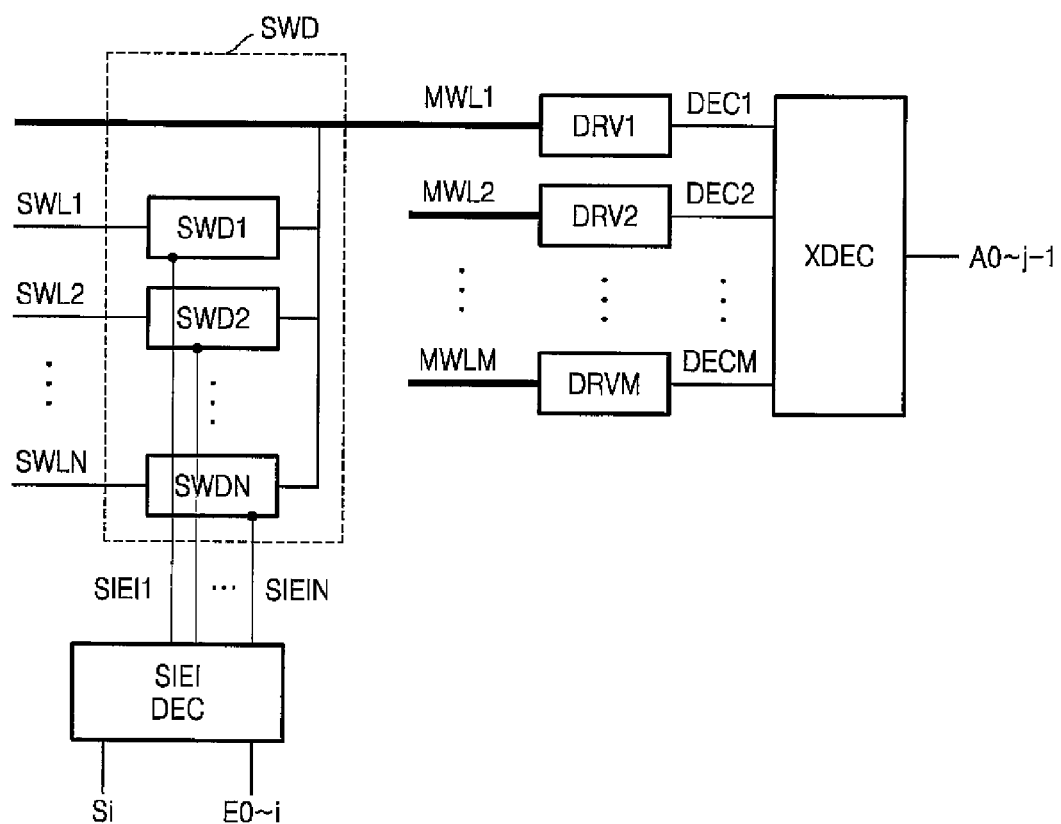
FIG. 6 is a detailed block diagram of a driver illustrated in FIG. 4 and FIG. 5, according to an embodiment of the present invention.

FIG. 6 is a detailed block diagram of the driver DRV illustrated in FIG. 4 and FIG. 5. If driver DRV is positioned adjacent to first decoder XDEC as shown in FIGS. 4 and 5, a bias voltage is applied to a first main word line MWL1 activated by first decoder XDEC. Here, first decoder XDEC decodes the predetermined bit values A0 to j-1 of the row address into first addresses DEC1, DEC2-DECM. Second decoder SIEI DEC decodes bit values E0 to i-1 of the row address into a second address SIEIN. The Nth local word line SWLN which corresponds to second address SIEIN is connected to the first main word line MWL1. Accordingly, the bias voltage applied to the first main word line MWL1 is transferred to the Nth local word line SWLN.

A local decoder SWD illustrated in FIG. 6 includes a plurality of sub local decoders SWD1 through SWDN. The sub local decoders SWD1 through SWDN include a plurality of transistors (not shown) which are turned on in response to the activation of a plurality of second addresses SIEI1 through SIEIN, respectively. Thus, a main word line is connected to a plurality of local word lines. If the bi-directional RRAM 200 includes the sub cell arrays SCA1 through SCAL as in FIG. 5, the second decoders SIEI DEC1 through SIEI DECL included in each of the sub cell arrays SCA1 through SCAL operate in response to the activation of a sub cell array selection signal Si.

Figure 7:
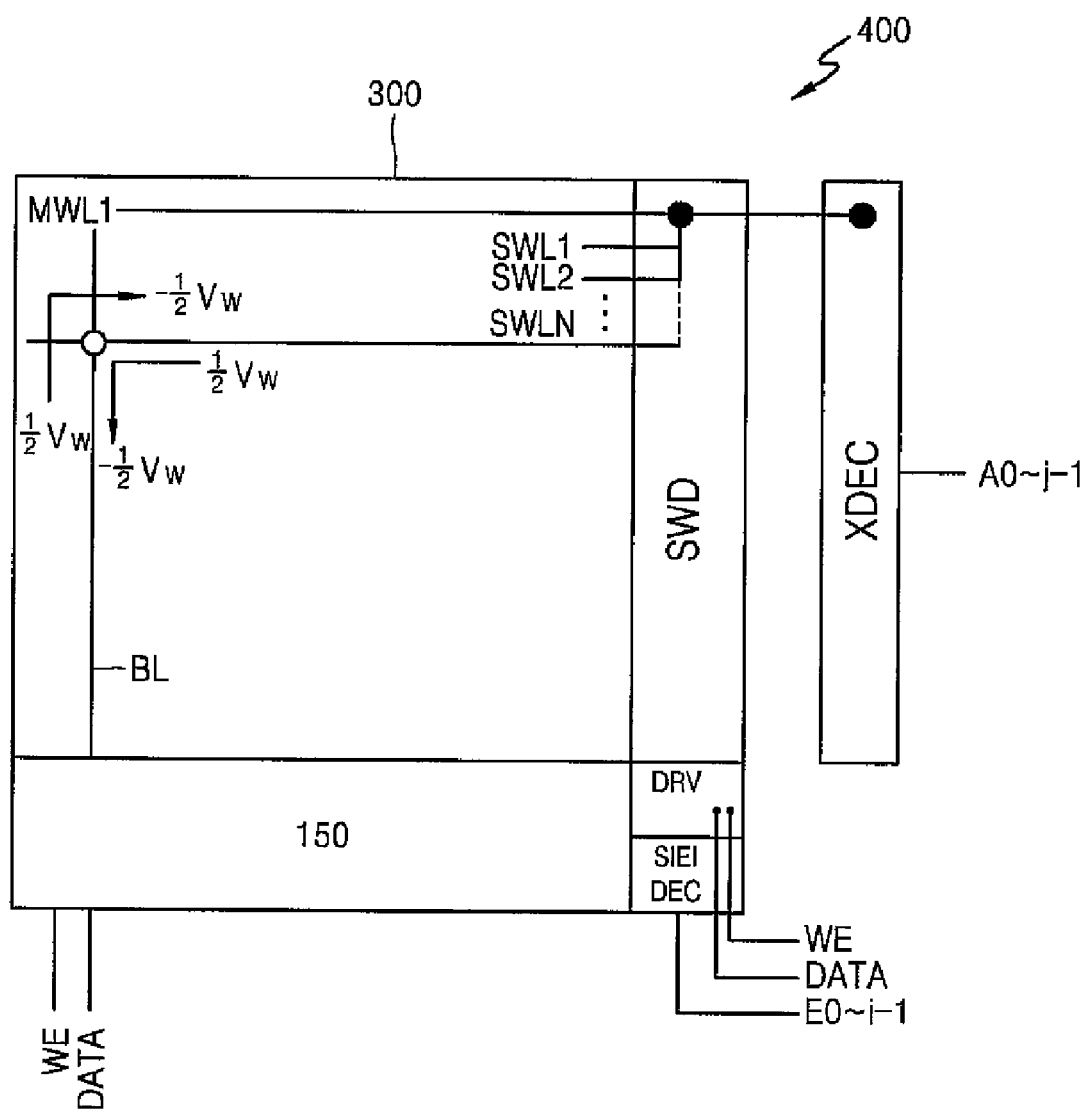
FIG. 7 is a schematic block diagram of a bi-directional RRAM according to an embodiment of the present invention.
Figure 8:
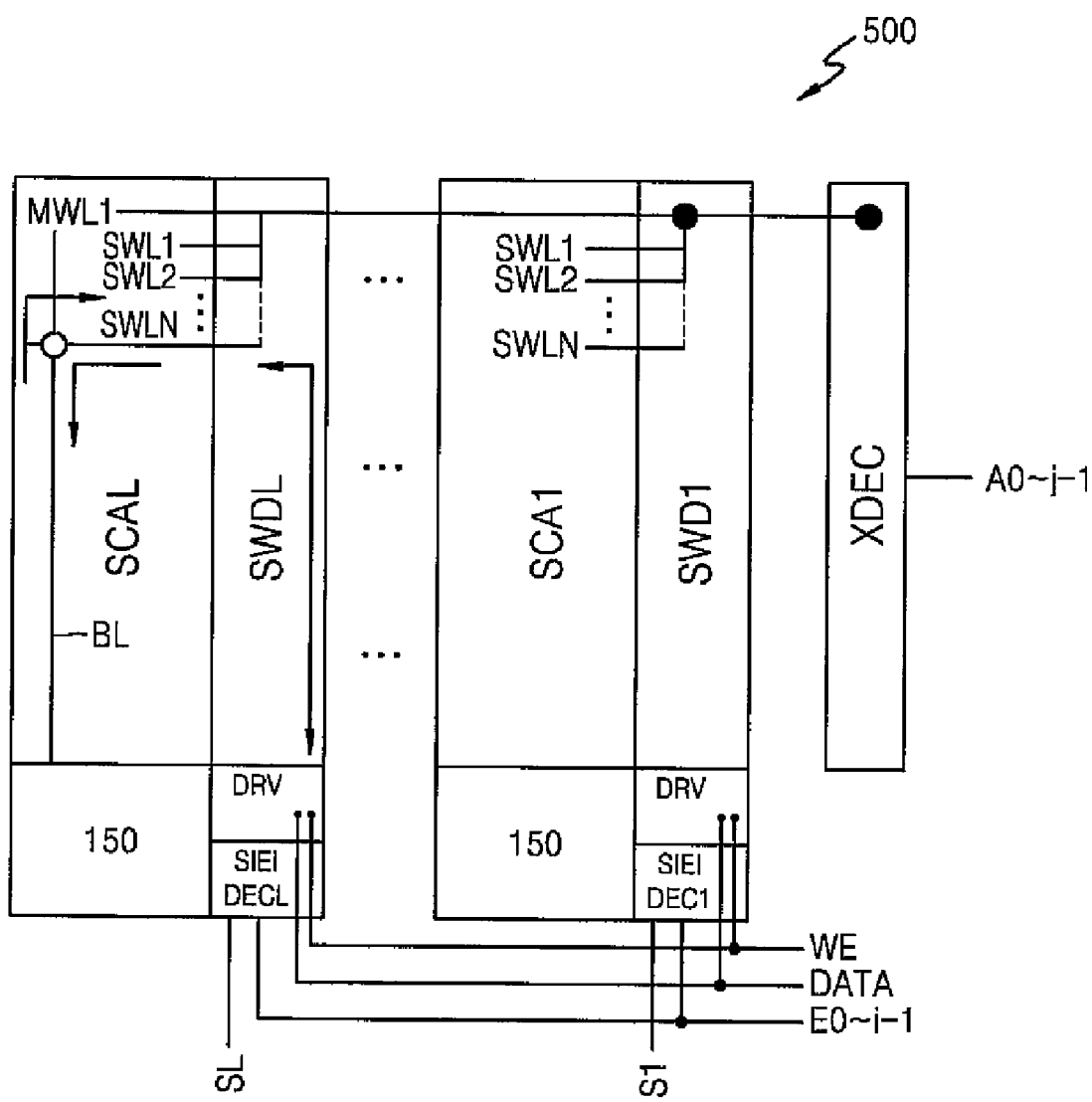
FIG. 8 is a schematic block diagram of a bi-directional RRAM according to an embodiment of the present invention.

FIG. 7 is a schematic block diagram of a bi-directional RRAM 400 and FIG. 8 is a schematic block diagram of a bi-directional RRAM 500 which is the same as bi-directional RRAMs 100 and 200 illustrated in FIGS. 4 and 5, respectively except that the drivers DRV are disposed adjacent to second decoders SIEI DECs.

Figure 9:
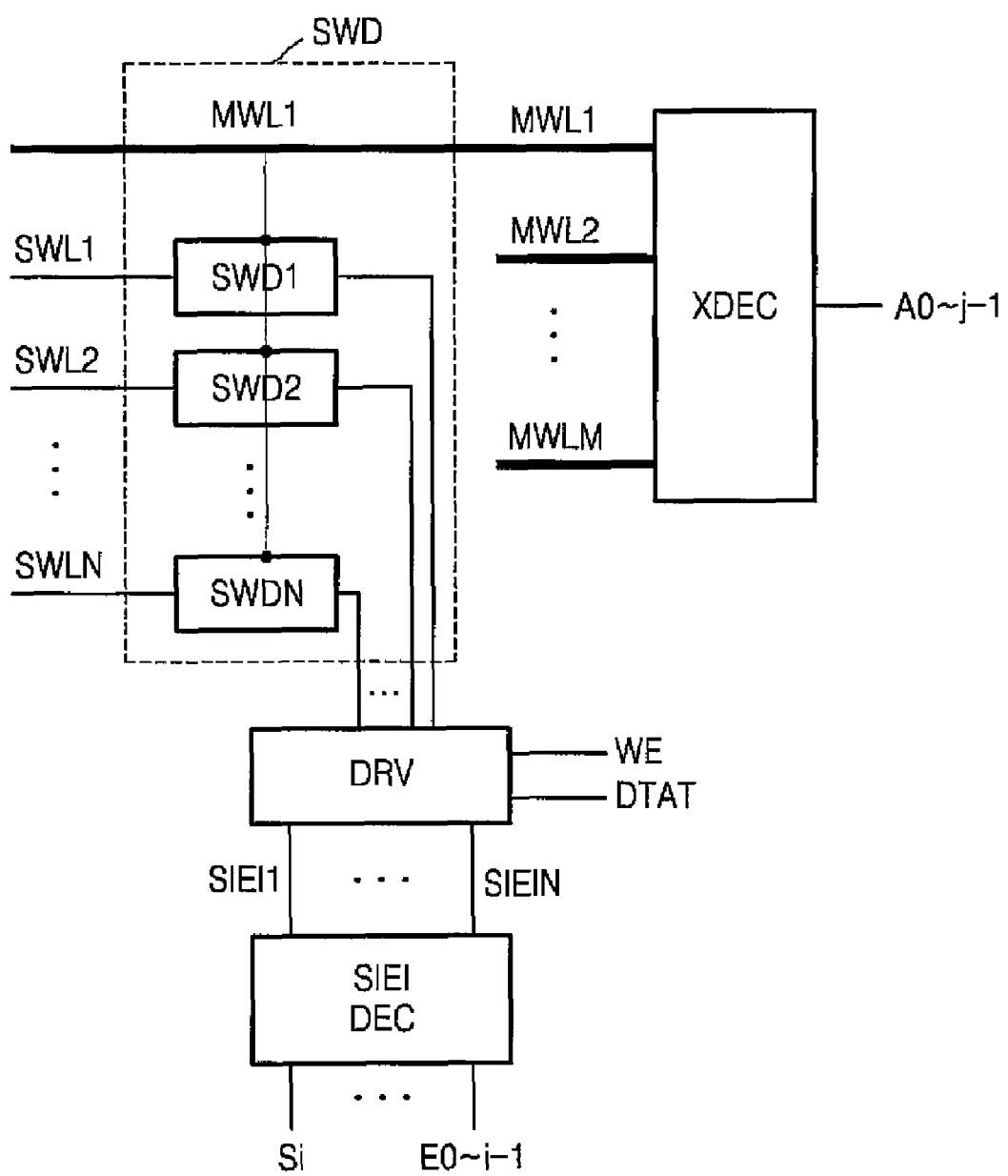
FIG. 9 is a detailed block diagram of a driver illustrated in FIG. 7 and FIG. 8, according to an embodiment of the present invention.

FIG. 9 is a block diagram of driver DRV illustrated in FIG. 7 and FIG. 8 in which a first decoder XDEC activates a first main word line MWL1 which corresponds to a first address DEC1. When the first main word line MWL1 is activated, a plurality of local word lines SWL1 through SWLN connected to the first main word line MWL1 are activated. Here, driver DRV applies bias voltages to a local word line SWLN which corresponds to a second address SIEIN from among the local word lines SWL1 through SWLN. Local decoder SWD includes a plurality of sub local decoders SWD1 through SWDN. Sub local decoders SWD1 through SWDN include a plurality of transistors (not shown) which are turned on in response to the activation of a main word line, respectively. Thus, the main word line is connected to a plurality of local word lines.

Figure 10A:
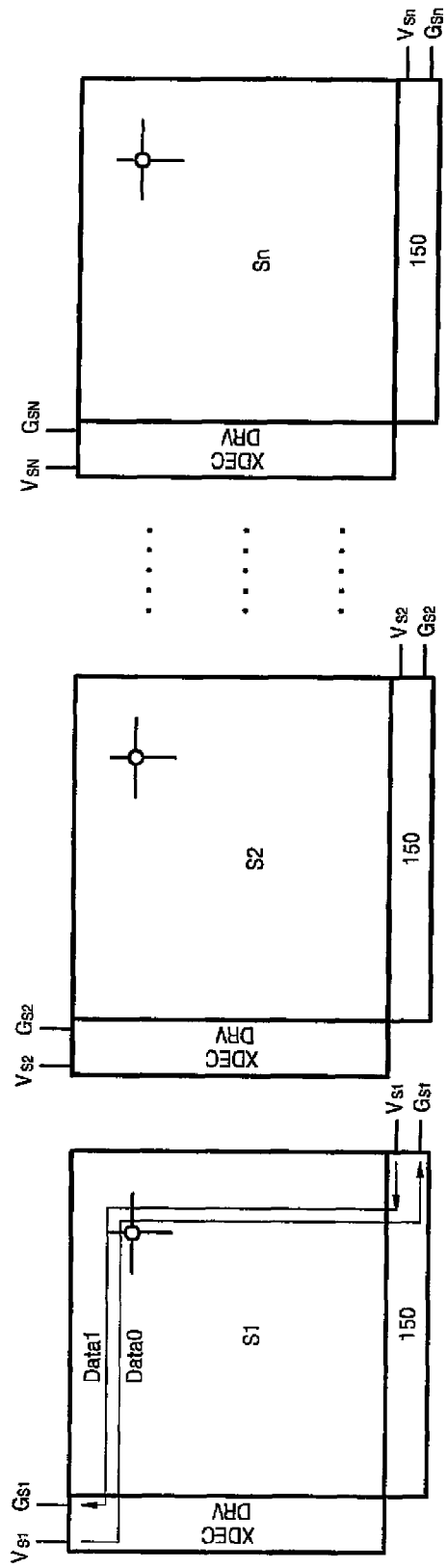
FIGS. 10A and 10B are schematic block diagrams respectively illustrating a plurality of sub cell arrays and a corresponding plurality of power switches used in the bi-directional RRAM illustrated in FIG. 8 and the operation of the power switches according to an embodiment of the present invention.
Figure 10B:
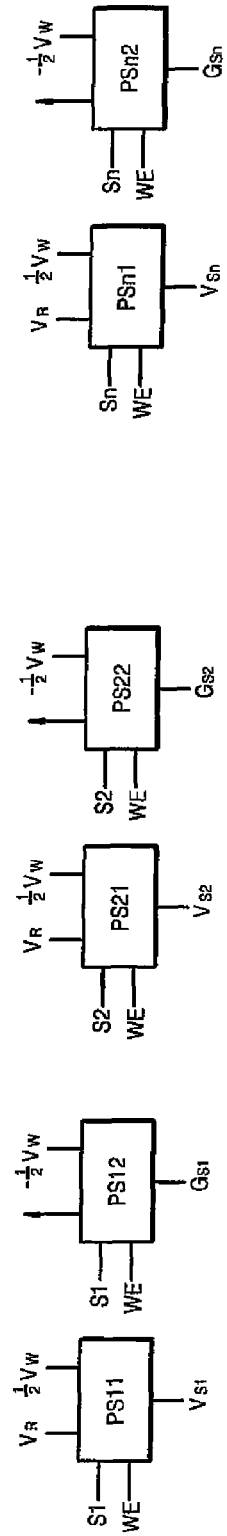

FIG. 10A is a block diagram illustrating the bi-directional RRAM 500 illustrated in FIG. 8. FIG. 10B is a block diagram illustrating a plurality of power switches PS11, PS12, PS21, PS22, through to PSn1, PSn2. Each of the plurality of power switches PS11, PS12, PS21, PS22, through to PSn1. PSn2 apply voltages to each one of the sub cell arrays S1, S2 through to Sn. The power switches PS11, PS12, PS21, PS22, through to PSn1, PSn2 include a plurality of first switching units PS11, PS21, through to PSn1 which individually switch between a first bias voltage ½VW and a reading voltage VR. The reading voltage VR may be a bias voltage applied to the word line for reading data stored in the sub cell array as the writing voltage ½ VW or −½ VW may be a bias voltage applied to the word line for writing data to the sub cell array. The power switches also include a plurality of second switching units PS12, PS22, through to PSn2 which individually switch between a second bias voltage −½VW and a ground voltage. The first switching units PS11, PS21, through to PSn1 apply the first bias voltage ½VW to respective sub cell arrays in response to the activation of a plurality of sub cell array selection signals S1 through Sn. The second switching units PS12, PS22, through to PSn2 apply the second bias voltage −½VW to respective sub cell arrays in response to the activation of the sub cell array selection signals S1 through Sn.

When a light enabling signal WE is not applied to the device, a first switching unit PS11 and a second switching unit PS12 output the reading voltage VR and a ground voltage. When the light enabling signal WE is activated and a first sub cell array S1 is selected, first switching unit PS11 switches the reading voltage VR to the first bias voltage ½VW. The second switching unit PS12 switches the ground voltage to the second bias voltage −½VW. Accordingly, the first and second switching units PS11 and PS12 respectively apply the first and second bias voltages ½VW and −½VW to the first sub cell array S1 as input voltages VS1 and GS1. Depending on a data value, the first bias voltage ½VW is applied to a word line and the second bias voltage −½VW is applied to a bit line, or the first bias voltage ½VW is applied to the bit line and the second bias voltage −½VW is applied to the word line. In the same manner, a first switching unit PS21 and a second switching unit PS22 respectively apply the first and second bias voltages ½VW and −½VW to the second sub cell array S2 as input voltages VS2 and GS2, and a first switching unit PSn1 and a second switching unit PSn2 respectively apply the first and second bias voltages ½VW and −½VW to the second sub cell array Sn as input voltages VSn and GSn.

The bi-directional RRAM includes a plurality of power switches corresponding to the number of sub cell arrays and supplies power only to a selected sub cell array, thereby reducing power loss associated with performing power switching on every memory cell. By including first and second decoders and decoding a row address in two steps, the bi-directional RRAM can perform addressing operations at high speeds while reducing chip size.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A non-volatile memory device comprising:
   a memory cell array comprising a plurality of memory cells disposed in a matrix of rows and columns, wherein each one of the memory cells in the memory cell array stores data in accordance with voltage polarities applied to opposite ends of the memory cell;
   a first decoder configured to decode a first portion of a row address associated with one of the plurality of memory cells into a first address, the first decoder being disposed in a row direction with respect to the memory cell array;
   a second decoder configured to decode a second portion of the row address different from the first portion into a second address, the second decoder being disposed in a column direction with respect to the memory cell array and the row address being completely defined by the first and second addresses;
   a driver communicating data to be stored in the memory cell array and configured to apply bias voltages to word lines in the memory cell array responsive to the first address or the second address in accordance with a value of the data to be stored,
   wherein the memory cell array further comprises a plurality of sub cell arrays,
   wherein the second decoder comprises a plurality of second decoders respectively disposed in each one of the plurality sub cell arrays, and
   wherein the driver comprises a plurality of drivers respectively disposed in each one of the plurality of sub cell arrays and adjacent to each one of the plurality of the second decoders; and
   a plurality of power switches, each respectively supplying power to one of the plurality of sub cell arrays, wherein each of the plurality of power switches comprises
      a first switching unit configured to switch between a first bias voltage and a reading voltage with respect to one of the plurality of sub cell arrays, and
      a second switching unit configured to switch between a second bias voltage and a ground voltage with respect to one of the plurality of sub cell arrays.

2. The non-volatile memory device of claim 1, wherein the word lines are main word lines and each have a plurality of local word lines connectable thereto, the local word lines connected to the memory cells, wherein the first address is for one of the main word lines and the second address is one for the local word lines.

3. The non-volatile memory device of claim 1 wherein the first decoder comprises a plurality of first decoders, and the drivers apply the bias voltages to the main word lines activated by the first decoders.

4. The non-volatile memory device of claim 3 wherein the second decoders connect the local word lines corresponding to the second address to the main word lines.

5. The non-volatile memory device of claim 4 wherein the bias voltages are transferred to the local word lines.

6. The non-volatile memory device of claim 1 wherein the bias voltages correspond to writing voltages defining the data to be stored.

7. The non-volatile memory device of claim 6 wherein respective magnitudes of the writing voltages are the same, and respective polarities of the writing voltages are different.

8. The non-volatile memory device of claim 1, wherein respective magnitudes of the bias voltages are the same, and respective polarities of the bias voltages are different.

9. The non-volatile memory device of claim 1, wherein the first switching unit applies the first bias voltage to the one of the plurality of sub cell arrays in response to activation of a sub cell array selection signal, and the second switching unit applies the second bias voltage to the one of the plurality of sub cell arrays in response to the activation of the sub cell array selection signal.

10. The non-volatile memory device of claim 1 wherein the non-volatile memory device is a bi-directional resistive random access memory (RRAM).

11. The non-volatile memory device of claim 10 wherein each one of the memory cells in the bi-directional RRAM comprises:
  a non-ohmic device configured to operate as a high-resistance material when voltages applied at opposite ends of the memory cell are within a predetermined range, and to operate as a low-resistance material when voltages applied at opposite ends of the memory cell are outside the predetermined range; and
  a resistance variable device having a resistance value that varies in accordance with the voltage polarities applied at opposite ends of the memory cell when the non-ohmic device operates as a low resistance material.

* * * * *